(12) United States Patent
Carter

(10) Patent No.: US 6,531,919 B1
(45) Date of Patent: Mar. 11, 2003

(54) PHASE INVERSION PREVENTION CIRCUIT FOR AN OPERATIONAL AMPLIFIER INPUT STAGE

(75) Inventor: Nathan R. Carter, Arroyo Grande, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/219,975

(22) Filed: Aug. 15, 2002

Related U.S. Application Data
(60) Provisional application No. 60/392,524, filed on Jun. 28, 2002.

(51) Int. Cl.[7] ................................................ H03F 3/45
(52) U.S. Cl. ........................ 330/252; 330/259; 330/261
(58) Field of Search ................................ 330/252, 257, 330/259, 292, 300, 261

(56) References Cited

U.S. PATENT DOCUMENTS

| | | | | |
|---|---|---|---|---|
| 4,439,696 A | * | 3/1984 | Yokoya | ........................ 307/494 |
| 5,418,491 A | * | 5/1995 | Bowers | ........................ 330/252 |
| 5,521,558 A | * | 5/1996 | Wilhelm et al. | ............... 331/57 |
| 5,614,860 A | * | 3/1997 | Osaki et al. | ................. 327/552 |

* cited by examiner

Primary Examiner—Henry Choe
(74) Attorney, Agent, or Firm—Koppel, Jacobs, Patrick & Heybl

(57) ABSTRACT

A phase inversion prevention circuit for an op amp input stage includes a detection circuit which detects when either of the input pairs' intrinsic diodes is near a forward-biased condition. When such a condition is detected, a switching network switches tail current from the primary input pair to a secondary input pair which takes over the input stage's amplifying duties. For a folded cascode input stage, the detection circuit preferably detects the onset of phase inversion by monitoring the cascode voltage which drives the cascode transistors. The outputs of the secondary input pair are connected to bypass the cascode transistors. Thus, when the onset of phase inversion is detected, the primary input pair is disabled, the second input pair is enabled, and with the cascode transistors bypassed the secondary input pair avoids phase inversion.

6 Claims, 4 Drawing Sheets

PHASE INVERSION PREVENTION CIRCUIT FOR AN OPERATIONAL AMPLIFIER INPUT STAGE

This application claims the benefit of provisional patent application No. 60/392,524 to Carter, filed Jun. 28, 2002.

BACKGROUND OF THE INVENTION

1. Field of the Invention

This invention relates to the field of operational amplifier input stages, and particularly to methods of preventing phase inversion for a cascoded transistor op amp input stage.

2. Description of the Related Art

A basic op amp input stage is shown in FIG. 1. A differential pair MN1 and MN2 have their sources connected to a common mode node 10, their gates connected to receive a differential input signal (V− and V+), and their drains connected to a load 12 (here, a pair of resistors). A tail current $I_{tail}$ is connected at common mode node 10. MN1 and MN2 conduct respective currents through load 12 in response to the input signal, which creates an output voltage $V_{out}$.

An op amp input stage has an associated common mode input range. For example, for FET and MOSFET input transistors, the common mode input range is defined as the voltage range over which the input devices are in the pinch-off region. For an N-channel FET, this condition is met when the FET's drain-source voltage $V_{ds}$ is greater than $V_{gs}-V_p$, where Vgs is the FET's gate-source voltage and $V_p$ is its pinch-off voltage.

There is an intrinsic diode (D1, D2) present between the gate and drain of each input FET (or, for a bipolar input stage, between the base and collector of each input transistor). Normally, the drain voltage of an input FET decreases with a rising input. However, if the gate voltage $V_g$ of an input FET exceeds its drain voltage $V_d$, the input stage is no longer within its common mode input range. If $V_g$ becomes sufficiently greater than $V_d$, the intrinsic diode becomes forward-biased, such that a condition known as "phase inversion" occurs. When in this condition, a rising input at the gate of an input FET causes the voltage at its drain to increase, rather than decrease as it would normally. Phase inversion also causes the entire tail current $I_{tail}$ to be drawn through the input terminals.

Phase inversion can easily occur in a folded cascode input stage, in which cascode transistors are inserted in series with the drains of respective input transistors (assuming a FET input stage). The cascode transistors are driven with a cascode voltage, which is typically arranged to float with the common mode input voltage $V_{cm}[=(V++V-)/2]$. If $V_{cm}$ gets too high, the transistor which creates the cascode voltage saturates, fixing the cascode voltage and thereby pinning the input FETs' drain voltages. When so pinned, the intrinsic diode of one of the input FETs can eventually become forward-biased, and phase inversion occurs.

SUMMARY OF THE INVENTION

A phase inversion prevention circuit for an operational amplifier input stage is presented, which overcomes the problems noted above.

The present phase inversion prevention circuit includes primary and secondary input pairs, and a detection circuit which detects when either of the primary input pairs' intrinsic diodes is near a forward-biased condition. When such a condition is detected, a switching network switches tail current from the primary input pair to the secondary input pair, which takes over the input stage's amplifying duties.

The invention is particularly suitable to use with folded cascode input stages, which are especially susceptible to phase inversion. In such applications, the detection circuit detects the onset of phase inversion by monitoring the which drives the cascode transistors. The outputs of the secondary input pair are connected to bypass the cascode transistors. Thus, when the onset of phase inversion is detected, the switching network operates to disable the primary input pair and enable the secondary input pair; with the cascode transistors bypassed, the secondary input pair avoids phase inversion.

Further features and advantages of the invention will be apparent to those skilled in the art from the following detailed description, taken together with the accompanying drawings.

DETAILED DESCRIPTION OF THE INVENTION

Figure 1:
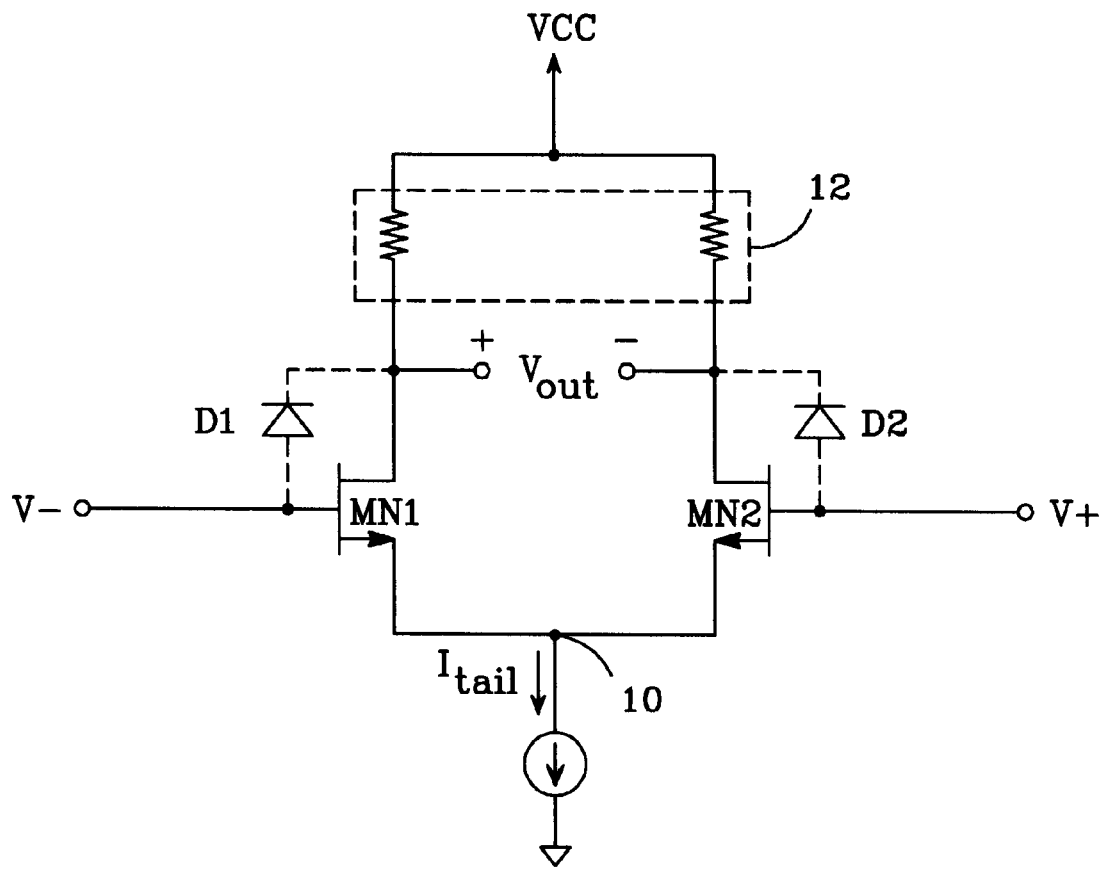
FIG. 1 is a schematic diagram of a known op amp input stage.
Figure 2:
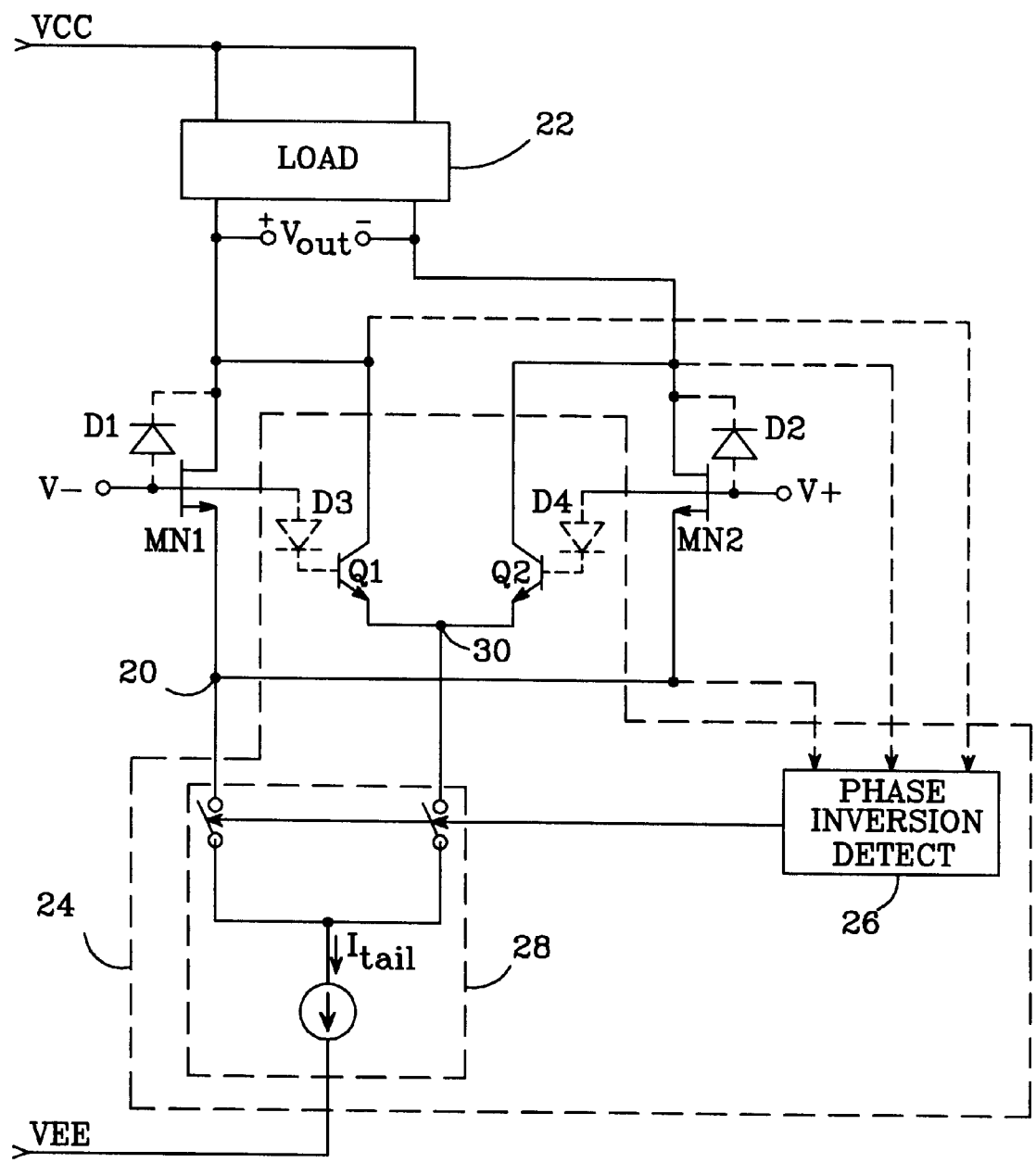
FIG. 2 is a schematic/block diagram which illustrates the basic principles of a phase inversion prevention circuit for an operational amplifier input stage per the present invention.

A diagram which illustrates the basic principles of the present invention is shown in FIG. 2. An operational amplifier's input stage includes a "primary" differential input pair MN1 and MN2. The current circuits of MN1 and MN2—the sources of FETs MN1 and MN2 in the exemplary embodiment shown—are connected together at a first common mode node 20. When a tail current is provided at common mode node 20, MN1 and MN2 conduct respective currents in response to a differential input signal applied to inputs V+ and V−. The respective currents are conducted through a load 22 to provide an output $V_{out}$.

As noted above, input transistors MN1 and MN2 have intrinsic diodes D1 and D2 between their respective gates and drains. Phase inversion occurs when the gate voltage of one of the input transistors becomes greater than its drain voltage such that the transistor's intrinsic diode becomes forward-biased.

The invention overcomes this problem with a phase inversion prevention circuit 24, which includes a phase inversion detection circuit 26, a switching network 28, and a "secondary" input pair Q1 and Q2, which are preferably bipolar transistors. Q1 and Q2 have their emitters connected together at a common mode node 30, their collectors connected to the drains of MN1 and MN2, respectively, and their bases connected to V− and V+, respectively.

Phase inversion detection circuit 26 is arranged to detect when either of intrinsic diodes D1 and D2 is near a forward-biased condition. Switching network 28 is arranged to connect a tail current $I_{tail}$ to either common mode node 20 (thereby enabling MN1 and MN2) or to common mode node 30 (thereby enabling Q1 and Q2) in response to a control signal produced by detection circuit 26. In operation, when detection circuit 26 is not detecting the onset of a forward-biased condition, switching network 28 connects tail current $I_{tail}$ to common mode node 20, such that primary input pair MN1 and MN2 are enabled and produce $V_{out}$. However, when detection circuit 26 detects that D1 and/or D2 is near a forward-biased condition, tail current $I_{tail}$ is switched from common mode node 20 to common mode node 30. This disables the primary input pair and enables secondary input pair Q1 and Q2, which now function to provide $V_{out}$. In this way, phase inversion for the primary input stage is avoided.

Note that though the primary input stage in FIG. 2 is made with FETs, the invention is equally applicable to a bipolar primary input stage. Bipolar transistors also have intrinsic diodes which can become forward-biased such that a phase inversion condition results. As with a FET input stage, this condition can be detected and prevented with the present invention.

The diagram of FIG. 2 merely illustrates the basic principles of the invention. For the circuit shown in FIG. 2, if the conditions are such that the primary input pair is near a phase inversion condition, the secondary input pair is likely to also be so threatened—since the two input pairs are essentially connected in parallel. One way to reduce this possibility is with the use of a pair of level shifting diodes D3 and D4, connected between V– and V+ and the inputs of Q1 and Q2, respectively. The diodes serve to shift the common mode input voltage range of the secondary input pair up by a diode drop, such that—over at least a limited common mode input voltage range—the secondary input stage will not phase invert even if the primary stage does.

Figure 3:
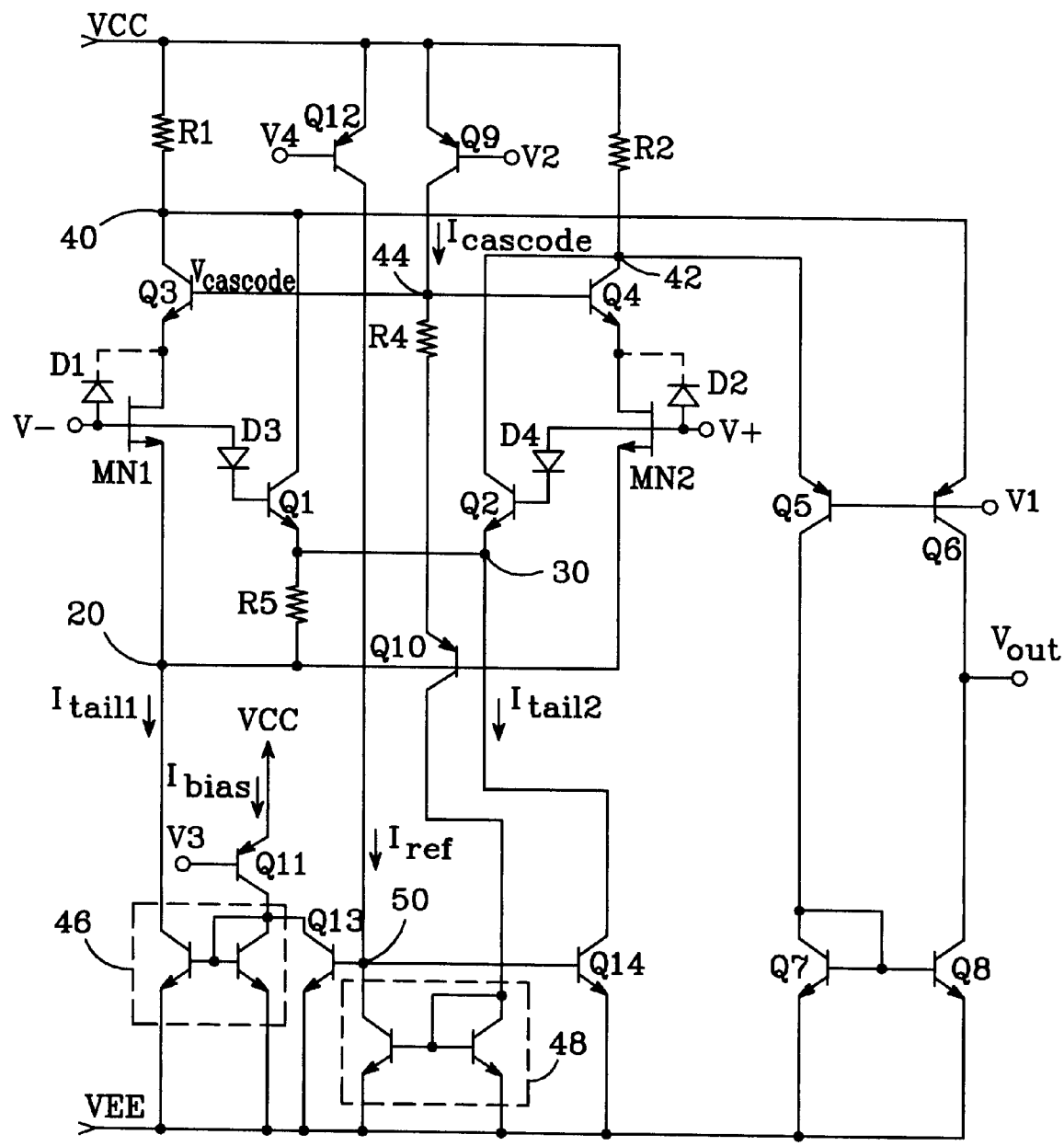
FIG. 3 is a schematic diagram of one possible embodiment of a phase inversion prevention circuit for an operational amplifier input stage per the present invention.

A more practical application of the invention is shown in FIG. 3. Here, the op amp's input stage is in a "folded cascode" configuration. This design is popular, as it results in a common mode input range which is greater than would be possible using a conventional pair of current mirrors to output the differential output current.

The folded cascode input stage includes primary input pair MN1 and MN2, having their sources connected to common mode node 20 as before. Here, however, the drain of MN1 is connected to an output terminal 40 (and to a supply voltage VCC through a load resistor R1) via a cascode transistor Q3, and the drain of MN2 is connected to an output terminal 42 (and to VCC through a load resistor R2) via a cascode transistor Q4. Differential output terminals 40 and 42 are connected to an output stage which includes transistors Q5–Q8, and which produces the stage's output voltage $V_{out}$.

In practice, cascode transistors Q3 and Q4 limit the drain-source voltages of the input FETs to a value set by a "cascode voltage" $V_{cascode}$ connected to drive Q3 and Q4. One mechanism for generating such a cascode voltage is shown in FIG. 3: a current source transistor Q9, connected to supply voltage VCC, conducts a current $I_{cascode}$ in response to a fixed bias voltage V2. The output of Q9 is connected to a resistor R4 at a node 44, and the other end of R4 is connected to a transistor Q10, the base of which is connected to common mode node 20. As long as Q9 is not in saturation, the current $I_{cascode}$ through Q10 and R4, and thus the voltage at node 44, is essentially constant with respect to node 20. The voltage at node 44 is the "cascode voltage" $V_{cascode}$.

$V_{cascode}$ is an essentially constant voltage which floats with $V_{cm}$. At some $V_{cm}$ value, current source transistor Q9 saturates. With Q9 saturated, $I_{cascode}$ starts to decrease with an increasing $V_{cm}$, which in turn reduces $V_{cascode}$. This reduces the voltages at the bases of Q3 and Q4, which in turn reduces the voltages at their emitters and at the drains of MN1 and MN2. With the MN1/MN2 drain voltages falling, an increase in $V_{cm}$ can forward bias one of intrinsic diodes D1 and D2 and thereby cause a phase inversion condition.

As noted above, the invention prevents a phase inversion condition by switching tail current from primary input pair MN1/MN2 to a secondary input pair when it is detected that a phase inversion condition is near. As shown in FIG. 3, the secondary input pair comprises bipolar transistors Q1 and Q2. The emitters of Q1 and Q2 are connected together at common mode node 30, their bases are connected to V– and V+, respectively, (preferably via respective diodes D3 and D4, discussed below), and their collectors are connected to output terminals 40 and 42, respectively. When so connected, the collectors of secondary input pair Q1/Q2 bypass cascode transistors Q3 and Q4, which substantially reduces the possibility of having their intrinsic diodes forward-biased by a high $V_{cm}$.

One way in which the onset of a phase inversion condition can be detected is by monitoring current $I_{cascode}$. As noted above, when current source transistor Q9 saturates, $I_{cascode}$ starts to decrease as $V_{cm}$ continues to increase. This decrease in $I_{cascode}$ can be used to indicate the onset of a phase inversion condition. One implementation of this approach is shown in FIG. 3. A current source transistor Q11 produces a bias current $I_{bias}$ in response to a fixed biased voltage V3, which is mirrored by a first current mirror 46 to produce a tail current $I_{tail1}$. This current is provided to common mode node 20 of primary input pair MN1/MN2. A second current mirror 48 mirrors $I_{cascode}$ to a "comparison node" 50. Another current source transistor Q12 produces a reference current $I_{ref}$ in response to a bias voltage V4; $I_{ref}$ is also provided to comparison node 50. Node 50 is connected to drive a diversion transistor Q13 which is connected to divert $I_{bias}$ from current mirror 46 when on. Node 50 is also connected to drive a transistor Q14, which produces a tail current $I_{tail2}$. $I_{tail2}$ is provided to common mode node 30 of secondary input pair Q1/Q2.

Currents $I_{cascode}$ and $I_{ref}$ are arranged such that, when Q9 is not in saturation, the cascode current $I_{cascode}$ mirrored to comparison node 50 is greater than $I_{ref}$. This keeps diversion transistor Q13 turned off, such that $I_{tail1}$ is generated and the primary input pair is enabled. However, when Q9 saturates, $I_{cascode}$ decreases; when $I_{cascode}$ decreases to $I_{ref}$, the voltage at the comparison node 50 (and the base of diversion transistor Q13) increases. This causes Q13 to turn on and divert $I_{bias}$ from current mirror 46. When Q13 is appropriately sized, all of $I_{bias}$ is diverted from current mirror 46, $I_{tail1}$ is reduced to zero, and primary input pair MN1/MN2 is disabled. At the same time, a rising voltage at comparison node 50 causes Q14 to begin providing $I_{tail2}$ to common mode node 30, thereby enabling secondary input pair Q1/Q2. The total current through the emitter of Q13—given by $I_{ref}+I_{bias}$ (when Q13 is sized to divert all of $I_{bias}$)—determines the tail current $I_{tail2}$, which can be scaled up or down by establishing an appropriate emitter area ratio between Q13 and Q14.

Once $I_{tail2}$ is on, it pulls approximately the same amount of current out of the folding nodes as does the primary input pair—thereby maintaining the dynamics of the system. The secondary pair takes over the function of the op amp, maintaining op amp gain and output voltage when the common mode input voltage range is exceeded. Note that when the differential input is within the common mode input voltage range, the secondary bipolar input pair is reverse-biased, thereby limiting the op amp's input current to that of a conventional FET amplifier.

When implemented as shown in FIG. 3, the exact input FET drain-source voltage when the tail currents are switched from the primary stage to the secondary stage can be set by the appropriate sizing of $I_{ref}$, $I_{cascode}$, and the transistors making up current mirror 48. The approximate common mode input voltage $V_{cm(off)}$ which corresponds to this drain-source voltage (for MN1 in this example) is given by:

$$V_{cm(off)} = VCC - V_{sat,Q9} - V_{be,Q3} - V_{ds} + V_{gs}$$

where $V_{sat,Q9}$ is Q9's saturation voltage, $V_{be,Q3}$ is Q3's base-emitter voltage, and $V_{ds}$ and $V_{gs}$ are MN1's drain-source and gate-source voltages, respectively.

As noted above, the bases of secondary input stage transistors Q1/Q2 are preferably connected to V− and V+ via diodes D3 and D4, respectively. The diodes serve to shift the common mode input range for the secondary input stage up by a diode drop. D3 and D4 also serve to limit the input bias current when the secondary input stage is disabled.

A resistor R5 is preferably connected between common mode nodes 20 and 30, to guarantee that the primary input stage turns back on when $V_{cm}$ returns to within the common mode input range. This resistor provides two functions: it maintains a small amount of current through the input FETs while the secondary input stage is enabled, and it provides a base current to Q10 so that Q9 can come out of saturation. The small amount of current maintained through the input FETs via R5 defines an operating point, just as the tail current defined the operating point for the primary stage's turn-off mechanism. The "turn-on" common mode voltage $V_{cm(on)}$ is defined by the same equation given above for $V_{cm(off)}$, except that $V_{gs}$ is defined by the size of R5 and not the tail current. For an optimally-sized R5, $V_{gs}$ will be close to a pinch-off voltage. R5 also forces the secondary bipolar input pair to be reverse-biased during normal operation, thereby reducing the input bias current.

When $V_{cm}$ returns to within the common mode input range, Q9 comes out of saturation, $I_{cascode}$ and $V_{cascode}$ return to their constant values, $I_{tail2}$ is turned off and $I_{tail1}$ is turned back on, and the primary input stage resumes operation.

The secondary input stage preferably comprises bipolar transistors. FET devices could theoretically be used, but would require that several diodes be stacked in series with each input to get the inputs at or above the supply voltage (required to prevent phase inversion), and to keep the gate voltages low enough to allow the FETs to function properly.

Figure 4:
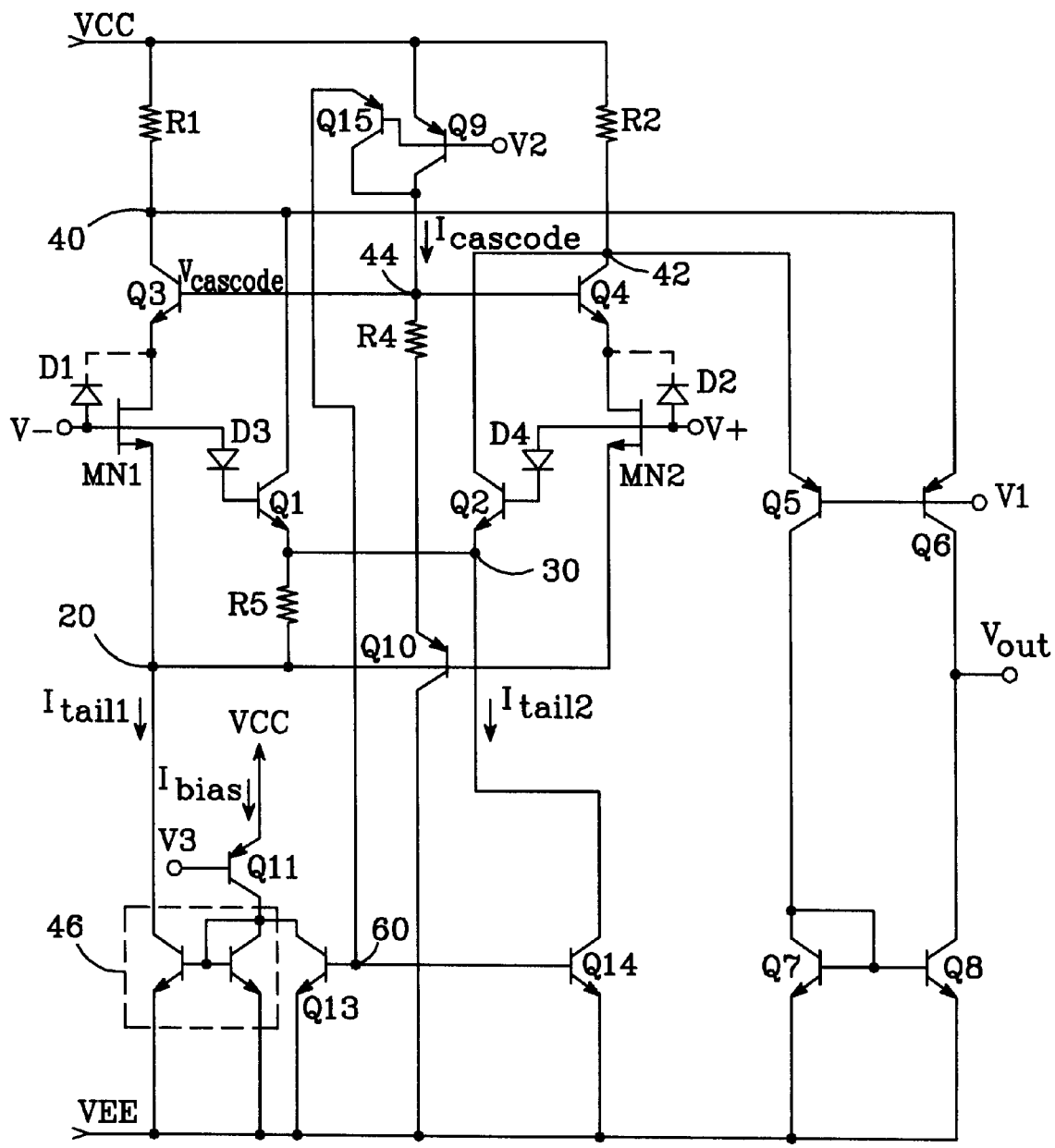
FIG. 4 a schematic diagram of another possible embodiment of a phase inversion prevention circuit for an operational amplifier input stage per the present invention.

An alternative mechanism for detecting the onset of phase inversion is shown in FIG. 4. Instead of comparing the current $I_{cascode}$ which generates cascode voltage $V_{cascode}$ to a reference current $I_{ref}$, the circuit in FIG. 4 senses the status of current source transistor Q9 using collector feedback. A PNP transistor Q15 has its base and collector connected in parallel with those of Q9, and its emitter is connected to a node 60 at the base of diversion transistor Q13. In operation, when Q9 saturates, current is transferred through Q15 to node 60. This causes diversion transistor Q13 to turn on and divert $I_{bias}$ from current mirror 46 as before.

Note that the specific circuit implementations shown in FIGS. 3 and 4 are merely exemplary. A number of other mechanisms could be employed to detect the onset of phase inversion, and to switch tail current from the primary input stage to the secondary input stage in response.

While particular embodiments of the invention have been shown and described, numerous variations and alternate embodiments will occur to those skilled in the art.

Accordingly, it is intended that the invention be limited only in terms of the appended claims.

I claim:

1. An operational amplifier input stage with a phase inversion prevention circuit, comprising:

an input stage comprising:
   a first differential pair comprising first and second transistors, each of which has a control input and first and second current circuit terminals, the control inputs of said first and second transistors connected to receive a differential input signal which has a common mode voltage $V_{cm}$, said first current circuit terminals connected together at a first common mode node, said first pair arranged to conduct respective currents which vary with said differential input signal at first and second output terminals, respectively, when a tail current $I_{tail1}$ is provided at said first common mode node, each of said first and second transistors having a respective intrinsic diode present between its control input and second current circuit terminal, and a phase inversion prevention circuit, comprising:
   a phase inversion detection circuit which detects when either of said intrinsic diodes is near a forward-biased condition,
   a second differential pair comprising third and fourth transistors, said third and fourth transistors being bipolar transistors having their bases connected to receive said differential input signal and their emitters connected together at a second common mode node, said second differential pair arranged to conduct respective currents which vary with said differential input signal at said first and second output terminals, respectively, when a tail current $I_{tail2}$ is provided at said second common mode node, and
   a switching network arranged to connect said second common mode node to $I_{tail2}$ when said phase inversion detection circuit detects that either of said intrinsic diodes is near a forward-biased condition and to connect said first common mode node to $I_{tail1}$ otherwise.

2. The input stage of claim 1, wherein said input stage is arranged in a folded cascode configuration with a first cascode transistor connected to a supply voltage at a third node and in series with said first transistor and a second cascode transistor connected to said supply voltage at a fourth node and in series with said second transistor, said third and fourth nodes being said first and second output terminals, respectively.

3. The input stage of claim 2, wherein said first and second cascode transistors are driven with a cascode voltage, further comprising a cascode voltage generating circuit which outputs said cascode voltage, said cascode voltage generating circuit arranged such that said cascode voltage decreases when either of said intrinsic diodes is near a forward-biased condition, and such that said cascode voltage is an essentially fixed voltage which floats with $V_{cm}$ otherwise.

4. The input stage of claim 3, wherein said phase inversion detection circuit is arranged to compare a cascode current $I_{cascode}$ which varies with said cascode voltage with a reference current $I_{ref}$ to detect when either of said intrinsic diodes is near said forward-biased condition.

5. The input stage of claim 4, wherein said switching network comprises:

a first current mirror circuit which generates $I_{tail1}$ in response to a bias current $I_{bias}$, a second current mirror which mirrors $I_{cascode}$ to a comparison node which also receives $I_{ref}$, a diversion transistor connected to said comparison node which diverts $I_{bias}$ from said first current mirror when the current mirrored to said comparison node is less than $I_{ref}$, and a transistor connected to conduct $I_{tail2}$ to said second common mode node in response to the current conducted by said diversion transistor.

6. The input stage of claim 1, further comprising:

a first diode connected between the base of said third transistor and one side of said differential input signal, and a second diode connected between the base of said fourth transistor and the other side of said differential input signal, such that the common mode input voltage range of said second differential pair is shifted up by a diode drop.

* * * * *